United States Patent
Britton et al.

(10) Patent No.: US 7,902,465 B1
(45) Date of Patent: Mar. 8, 2011

(54) OPTIMIZING PCB POWER AND GROUND CONNECTIONS FOR LEAD FREE SOLDER PROCESSES

(75) Inventors: James David Britton, El Paso, TX (US); Jorge Eduardo Martinez-Vargas, San Francisco, CA (US)

(73) Assignee: Oracle America, Inc., Redwood City, CA (US)

( * ) Notice: Subject to any disclaimer, the term of this patent is extended or adjusted under 35 U.S.C. 154(b) by 0 days.

(21) Appl. No.: 12/651,150

(22) Filed: Dec. 31, 2009

(51) Int. Cl.
*H01R 12/04* (2006.01)
*H05K 1/11* (2006.01)

(52) U.S. Cl. ......................... 174/262; 174/260

(58) Field of Classification Search .................. 174/260, 174/261, 262; 361/792, 793, 794, 795
See application file for complete search history.

(56) References Cited

U.S. PATENT DOCUMENTS

| | | | |
|---|---|---|---|
| 5,371,653 A * | 12/1994 | Kametani et al. | 361/721 |
| 6,521,842 B2 * | 2/2003 | Brinthaupt et al. | 174/252 |
| 7,047,628 B2 * | 5/2006 | Lee | 29/830 |

* cited by examiner

*Primary Examiner* — Ishwarbhai B Patel
(74) *Attorney, Agent, or Firm* — Marsh Fischmann & Breyfogle LLP; Kent A. Lembke

(57) ABSTRACT

Apparatuses and methods that provide for enhanced connections between PTHs of multi-layer PCBs and electronic component leads, pins or the like, are described herein. The apparatuses and methods improve the likelihood that the PTHs are completely filled with solder thereby advantageously allowing the PCBs to exhibit high mechanical and electrical reliability. Complete filling of PTHs is achieved by configuring the electrically conductive layers within the multi-layer PCB stack in a manner that reduces the heat sinking effects of the layers during the soldering process. In this regard, the PTHs may not directly contact all of the internal ground or power planes, so the heat sinking or heat transfer effects are reduced. This feature enables molten solder to substantially or completely fill an entire PTH before freezing.

18 Claims, 7 Drawing Sheets

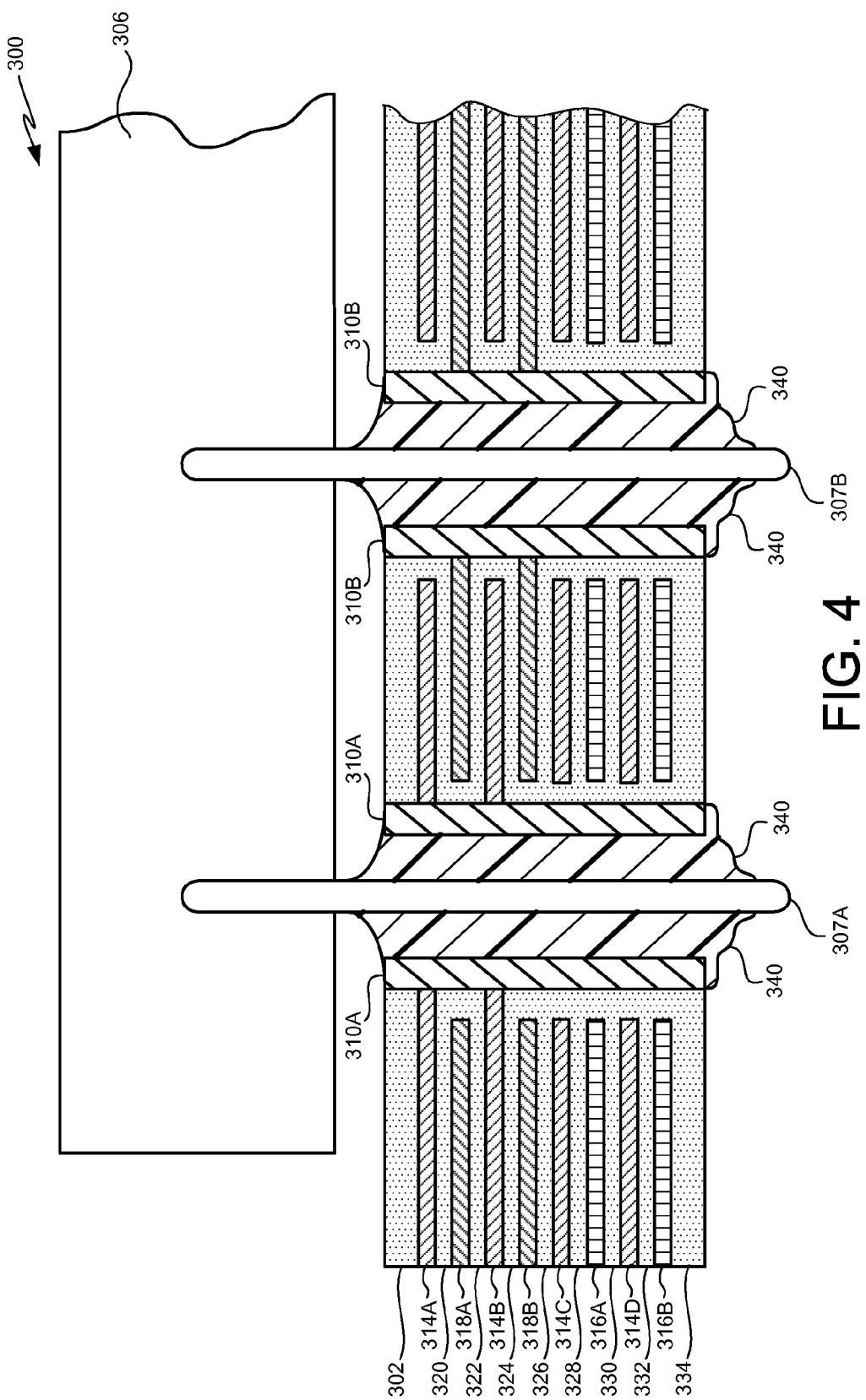

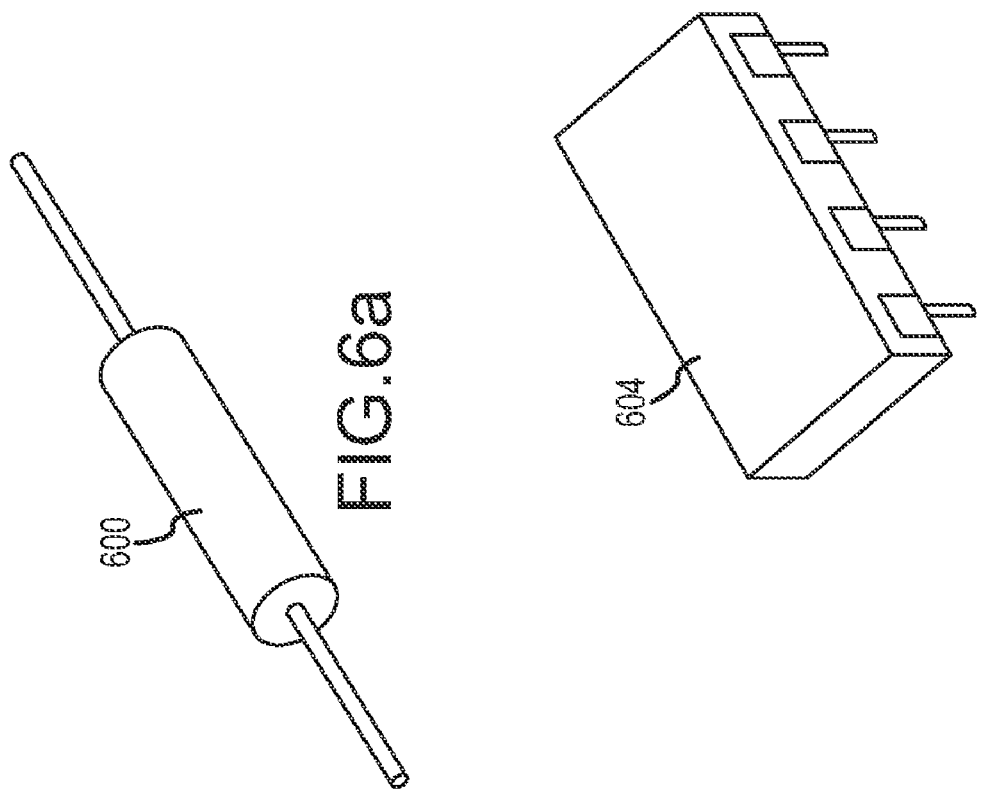

OPTIMIZING PCB POWER AND GROUND CONNECTIONS FOR LEAD FREE SOLDER PROCESSES

BACKGROUND OF THE INVENTION

Printed circuit boards, or PCBs, are generally used to mechanically support and electrically connect electronic components using conductive pathways, or traces etched from sheets of electrically conductive material (e.g., typically copper sheets) laminated onto a non-conductive substrate. A PCB populated with electronic components is referred to as a printed circuit assembly (PCA), also known as a printed circuit board assembly (PCBA). PCBs are generally rugged, inexpensive, and can be highly reliable. They require much more layout effort and higher initial cost than either wire-wrapped or point-to-point constructed circuits, but are much cheaper and faster for high-volume production. Some PCBs have trace layers inside the PCB and are called multi-layer PCBs, and may, for example, be formed by bonding together separately etched thin boards. Some multi-layer PCBs may include several layers (e.g., 4 layers, 12 layers, 24 layers, or more). Among the layers, the electrically conductive sheets are typically specified in terms of an amount of electrically conductive material (e.g., copper weight in ounces such as 0.5 oz, 1.0 oz, etc.), and such amount translates to the "thickness" of a given electrically conductive sheet or combined sheets (e.g. two 0.5 oz sheets are the same thickness as one 1.0 oz sheet).

Holes are typically drilled through a PCB with tiny drill bits (e.g., made of solid tungsten carbide) and/or LASERs in order to connect components to different layers of the PCB. The drilling may be performed by automated drilling machines, with the placement of the holes controlled by a drill tape or a computer generated drill file. The drill file describes the location and size of each hole to be drilled in the PCB. These holes are generally referred to as "vias." These vias are often plated with conductive material (e.g., copper or aluminum) forming annular rings, which allow the electrical and thermal connection of conductors on opposite sides of a PCB.

It is also possible with controlled-depth drilling, laser drilling, or by pre-drilling the individual sheets of the PCB before lamination, to produce holes that connect only some of the copper layers, rather than passing through the entire board. These holes are called "blind vias" when they connect an internal copper layer to an outer layer, or "buried vias" when they connect two or more internal copper layers and no outer layers. The walls of the vias, for boards with 2 or more layers, are generally plated with copper to form plated-through-holes (PTHs) that electrically connect the conducting layers of the PCB.

After the printed circuit board (PCB) is completed, electronic components must be attached to the PCB to form a functional PCBA. In through-hole construction, electronic component leads, pins or the like are inserted in PTHs in the PCB. In surface-mount technology (SMT) construction, the components are placed on pads or lands on the outer surfaces of the PCB. In both kinds of construction, component leads are electrically and mechanically fixed to the PCB with molten metal solder.

PTH electronic components may be attached to a PCB using a soldering technique referred to as wave soldering. Wave soldering is a large-scale soldering process by which electronic components are soldered to a PCB to form an electronic assembly. The name is derived from the use of waves of molten solder to attach metal components to the PCB. The process uses a tank to hold a quantity of molten solder, and the components are inserted into or placed on the PCB and the loaded PCB is passed across a pumped wave or fountain of solder. The solder "wets" the exposed metallic areas of the board (e.g., those not protected with solder mask, a protective coating that prevents the solder from bridging between connections), creating a reliable mechanical and electrical connection. The process is much faster and can create a higher quality product than manual soldering of components. Wave soldering is used for both through-hole printed circuit assemblies and surface mount assemblies.

While there are many types of wave solder machines, the basic components and principles of these machines are generally the same. A standard wave solder machine includes three zones: the fluxing zone, the preheating zone, and the soldering zone. An additional fourth zone, a cleaning zone, may also be used depending on the type of flux applied.

When a PCB enters the fluxing zone, a fluxer applies flux to the underside of the board. Two types of fluxers are used: a spray fluxer and a foam fluxer. For either flux application method, precise control of flux quantities is required. Too little flux will cause poor joints, while too much flux may cause cosmetic or other problems. Also, as can be appreciated, the types of flux may affect the end result.

The PCB will then enter the preheating zone. The preheating zone consists of convection heaters, which blow hot air onto the PCB to increase its temperature. Generally, preheating is necessary to activate the flux, and to remove any flux carrier solvents. Preheating is also necessary to prevent thermal shock, which may occur when a PCB is suddenly exposed to the high temperature of the molten solder wave.

The tank of molten solder has a pattern of standing waves (or, in some cases, intermittent waves) on its surface. When the PCB is moved over this tank, the solder waves contact the bottom of the board, and stick to the solder pads and component leads by surface tension. For the pins of PTH components, molten solder fills the holes around the pins by capillary action. Precise control of wave height is required to ensure solder is applied to all areas but does not splash to the top of the board or other undesired areas. This process is sometimes performed in an inert gas nitrogen ($N_2$) atmosphere to increase the quality of the joints.

As the thickness of a PCB increases (e.g., above 100 mils, 150 mils, 200 mils, or more) and the combined weight of the copper sheets increases (e.g., above 0.5 oz, 1.0 oz, 1.5 oz, 2.0 oz, or more), it may become more difficult to successfully fill the PTHs during the soldering process. One cause of the increased difficulty is that the molten solder tends to cool ("freeze") prematurely before it has traveled from the bottom of the PCB to the top. The problem of premature freezing of the molten solder can be particularly acute when lead free solder is used in the soldering process. This problem can be further exaggerated in PTHs that are used for ground and power connections. The reason for this is that a multilayered PCB may include several ground or power planes (e.g., 4 layers, 8 layers, 12 layers, or more) that include large sheets of copper. The multiple layers of copper sheets may conduct heat away from the molten solder (i.e., act as heat sinks), causing the solder to freeze prematurely and causing the PTH to be only partially filled with solder (e.g., 75% filled, 50% filled, or less). When the PTH is only partially filled with solder, the mechanical and electrical integrity of the solder connection may be significantly reduced or may even be ineffective. In this regard, standards have been set to require a minimum amount of solder that fills a through hole for various components. For example, the Institute for Interconnecting and Packaging Electronic Circuits (IPC) requires solder to fill at least 75% of the through hole for a signal pin and at least 50% of the through hole for a ground or power pin.

FIGS. 1 and 2 illustrate top and cross-sectional views of a PCB 100 that includes PTH components. The PCB 100 is configured with a resistor 104 and an integrated circuit (IC) 106. The PCB 100 includes a plurality of PTHs 110A-110H that may be used to couple electronic components (e.g., the resistor 104 and the IC 106) from the top layer 102 of the PCB 100 to one or more conductors (not shown in FIG. 1) within or on the bottom surface of the PCB 100. In this regard, the PTHs 110 may receive component leads 105A-105B, 107A-107-E extending from the electronic components 104, 106. The PCB 100 may also include a plurality of metal traces (e.g., copper traces 111) that are operative to couple different components of the PCB 100 together. The component leads 105A-105B, 107A-107E may also be referred to herein as pins.

FIG. 2 illustrates a cross-sectional view of a portion of the PCB 100 shown in FIG. 1 cut at the line 2-2. As shown, the PCB 100 includes a plurality of dielectric layers 102, 120, 122, 124, 126, 128, 130, 132 and 134. The PCB 100 also includes a plurality of electrically conductive layers 114A-114D, 116A-116B, 118A-118B disposed between (or outside of) the dielectric layers (e.g., the conductive and dielectric layers alternate). In the example shown, the IC 106 is coupled to the conductive layers 114A-114-D (e.g., ground planes) of the PCB 100 by soldering a first pin 107A (e.g. the ground pin) of the IC 106 to the PCB 100 using a first PTH 110A partially filled with solder 140. The IC 106 is also coupled to the conductive layers 118A-118-B (e.g., power planes) of the PCB 100 by soldering a second pin 107B (e.g. the power pin) of the IC 106 to the PCB 100 using a second PTH 110B partially filled with solder 140. Additional pins (not shown in FIG. 2) of the IC 106 may be coupled to additional conductive layers 116A-116B (e.g. signal planes) of the PCB 100 by soldering the additional pins of the IC 106 received within additional PTHs (not shown in FIG. 2) of the PCB 100. In this regard, the PCB 100 may include signal planes, ground planes, or power planes that are connected to other components.

As shown, solder 140 is used to mechanically and electrically couple the IC 106 to the PCB 100. In this regard, the pins 107A-107B are respectively coupled via the solder 140 and the respective PTHs 110A-110B to the respective conductive layers 114A-114D, 118A-118B. It is noted that the conductive layers 116A-116B (e.g. signal planes) and 118A-118B (e.g., power planes) do not contact the conductive lining of the first PTH 110A and are therefore not connected to the first pin 107A. Likewise, the conductive layers 114A-114D (e.g. ground planes) and 116A-116B (e.g., signal planes) do not contact the conductive lining of the second PTH 110B and are therefore not connected to the second pin 107B.

As shown, the solder 140 only partially fills the openings of the PTHs 110A-110B. This may be due to the heat sinking effects caused by the ground or power planes 114A-114B and 118A-118B that are coupled to conductive linings of the PTHs 110A-110B. That is, during the soldering process, molten solder 140 fills the openings of the PTHs 110A-110B from the bottom to the top via capillary action, losing heat in the process. If the molten solder 140 cools too rapidly, it may freeze prematurely, causing the opening in the PTHs 110A-110B to be only partially filled as shown. Since the PTHs 110A-110B are coupled to potentially large sheets of copper (e.g., the ground or power planes 114A-114D, 118A-118B) which have a high heat transfer coefficient, the heat of the molten solder 140 is dissipated rapidly through these electrical and heat conducting layers.

SUMMARY OF THE INVENTION

Accordingly, the present embodiments provide apparatuses and methods that provide for enhanced connections between PTHs of multi-layer PCBs and electronic component leads, pins or the like, particularly when the components are attached to the multi-layer PCB using a lead-free solder process. The apparatuses and methods improve the likelihood that the PTHs are completely filled with solder thereby advantageously allowing the PCBs to exhibit high mechanical and electrical reliability. Complete filling of PTHs is achieved by configuring the electrically conductive layers within the multi-layer PCB stack in a manner that reduces the heat sinking effects of the layers. In this regard, the PTHs may not directly contact all of the internal ground or power planes, so the heat sinking or heat transfer effects are reduced. This feature enables molten solder to substantially or completely fill an entire PTH before freezing. Various features and embodiments are described in detail below.

According to one aspect of the present invention, a multi-layer printed circuit board (PCB) is provided. The multi-layer PCB includes a plurality of electrically conductive layers with dielectric material disposed between the electrically conductive layers, with the plurality of electrically conductive layers including power planes and ground planes. The multi-layer PCB further includes a first plated through-hole that extends through the multi-layer printed circuit board, with the first plated through-hole including an electrically conductive lining that forms a barrel for receiving a first lead of an electronic component. The multi-layer PCB also includes a second plated through-hole that extends through the multi-layer printed circuit board, with the second plated through-hole including an electrically conductive lining that forms a barrel for receiving a second lead of the electronic component. Among the plurality of electrically conductive layers is a first subset of the plurality of electrically conductive layers. Each layer of the first subset of the plurality of electrically conductive layers comprises a ground plane that is electrically and mechanically connected to the electrically conductive lining of the first plated through-hole. Also among the plurality of electrically conductive layers is a second subset of the plurality of electrically conductive layers. Each layer of the second subset of the plurality of electrically conductive layers comprises a power plane that is electrically and mechanically connected to the electrically conductive lining of the second plated through-hole. Further, the number of ground planes included in the first subset equals the number of power planes included in the second subset, although the number of ground planes included in the first subset may be fewer than the total number of ground planes included in the multi-layer PCB.

According to another aspect of the present invention, a multi-layer printed circuit board is provided. The multi-layer PCB includes a plurality of electrically conductive layers with dielectric material disposed between the electrically conductive layers. The multi-layer PCB further includes a first plated through-hole extending through the multi-layer printed circuit board, with the first plated through-hole including an electrically conductive lining forming a barrel for receiving a first lead of an electronic component. The multi-layer PCB also includes a second plated through-hole that extends through the multi-layer printed circuit board, with the second plated through-hole including an electrically conductive lining that forms a barrel for receiving a second lead of the electronic component. Among the plurality of electrically conductive layers is a first subset of the plurality of electrically conductive layers. Each layer of the first subset of the plurality of electrically conductive layers comprises an amount of an electrically conductive material and is electrically and mechanically connected to the electrically conductive lining of the first plated through-hole. Also among the plurality of electrically conductive layers is a second subset of the plurality of electrically conductive layers. Each layer of the second subset of the plurality of electrically conductive layers comprises an amount of an electrically conductive material and is electrically and mechanically connected to the electrically conductive lining of the second plated through-hole. Further, a total of the amounts of the electrically conductive material comprising the first subset of the plurality of electrically conductive layers is determined in accordance with a predetermined ratio to a total of the amounts of the electrically conductive material comprising the second subset of the plurality of electrically conductive layers. In this regard, the electrically conductive layers in the first subset may, for example, be comprised of the same total amount of electrically conductive material (e.g., ounces or grams of copper) as the total amount of electrically conductive material (e.g. ounces or grams of copper) comprising the electrically conductive layers in the second subset. This provides the combined layers in the first subset with the same electrical conductive capacity as the combined layers in the second subset even though the total amount of electrically conductive material may be distributed among fewer, more, or the same number of layers in the first subset as in the second subset.

According to a further aspect of the present invention, a method of attaching an electronic component to a multi-layer printed circuit board is provided. The method includes providing a multi-layer printed circuit board that includes a plurality of electrically conductive layers with dielectric material disposed between the electrically conductive layers, a first plated through-hole that extends through the multi-layer printed circuit board, with the first plated through-hole including an electrically conductive lining that forms a barrel for receiving a first lead of the electronic component, a second plated through-hole that extends through the multi-layer printed circuit board, with the second plated through-hole including an electrically conductive lining that forms a barrel for receiving a second lead of the electronic component, a first subset of the plurality of electrically conductive layers, wherein each layer of the first subset of the plurality of electrically conductive layers comprises an amount of an electrically conductive material and is electrically and mechanically connected to the electrically conductive lining of the first plated through-hole, and a second subset of the plurality of electrically conductive layers, wherein each layer of the second subset of the plurality of electrically conductive layers comprises an amount of an electrically conductive material and is electrically and mechanically connected to the electrically conductive lining of the second plated through-hole, and wherein a total of the amounts of the electrically conductive material comprising the first subset of the plurality of electrically conductive layers is determined in accordance with a predetermined ratio to a total of the amounts of the electrically conductive material comprising the second subset of the plurality of electrically conductive layers. In this regard, the electrically conductive layers in the first subset may, for example, be comprised of the same total amount of electrically conductive material (e.g., ounces or grams of copper) as the total amount of electrically conductive material (e.g. ounces or grams of copper) comprising the electrically conductive layers in the second subset. This provides the combined layers in the first subset with the same electrical conductive capacity as the combined layers in the second subset even though the total amount of electrically conductive material may be distributed among fewer, more, or the same number of layers in the first subset as in the second subset. The method also includes positioning the first lead of the electronic component within the first plated through-hole, positioning the second lead of the electronic component within the second plated through-hole, soldering the first lead to the electrically conductive lining of the first plated through-hole to electrically couple the first electrical lead to each layer of the first subset of the plurality of electrically conductive layers, and soldering the second lead to the electrically conductive lining of the second plated through-hole to electrically couple the second electrical lead to each layer of the second subset of the plurality of electrically conductive layers. In this regard, the soldering process that is employed may, for example, be a wave soldering process, and the solder may, for example, be lead-free solder.

In addition to the exemplary aspects and embodiments described above, further aspects and embodiments will become apparent by reference to the drawings and by study of the following descriptions.

BRIEF DESCRIPTION OF THE DRAWINGS

FIG. 4 is a cross-sectional view showing one embodiment of a multi-layer PCB in which the PTHs are completely filled.

FIGS. 6A-6C illustrate various exemplary electronic components that include leads, pins or the like that may be received in the PTHs of multi-layer PCBs such as shown in FIGS. 3-5B.

DETAILED DESCRIPTION

Figure 1:
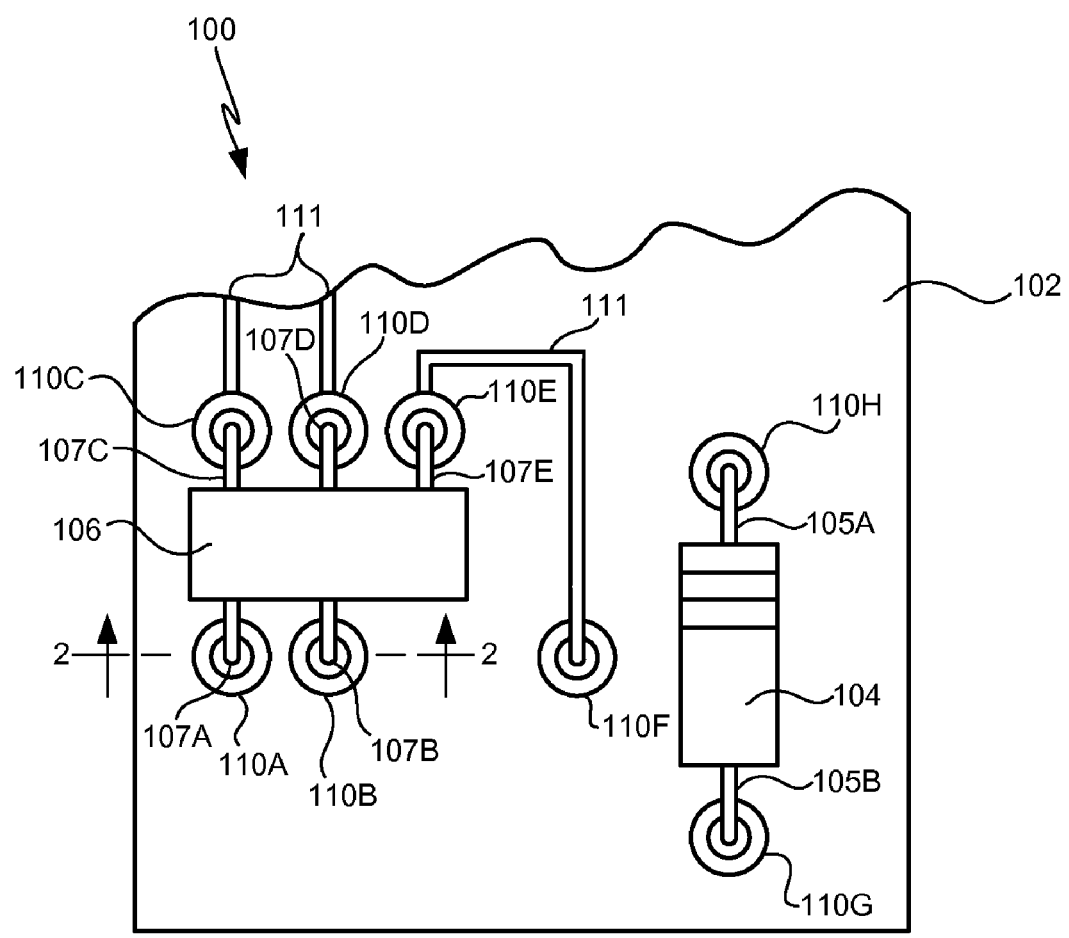
FIG. 1 illustrates a prior art multi-layer PCB configured with various electronic components including an IC.
Figure 2:
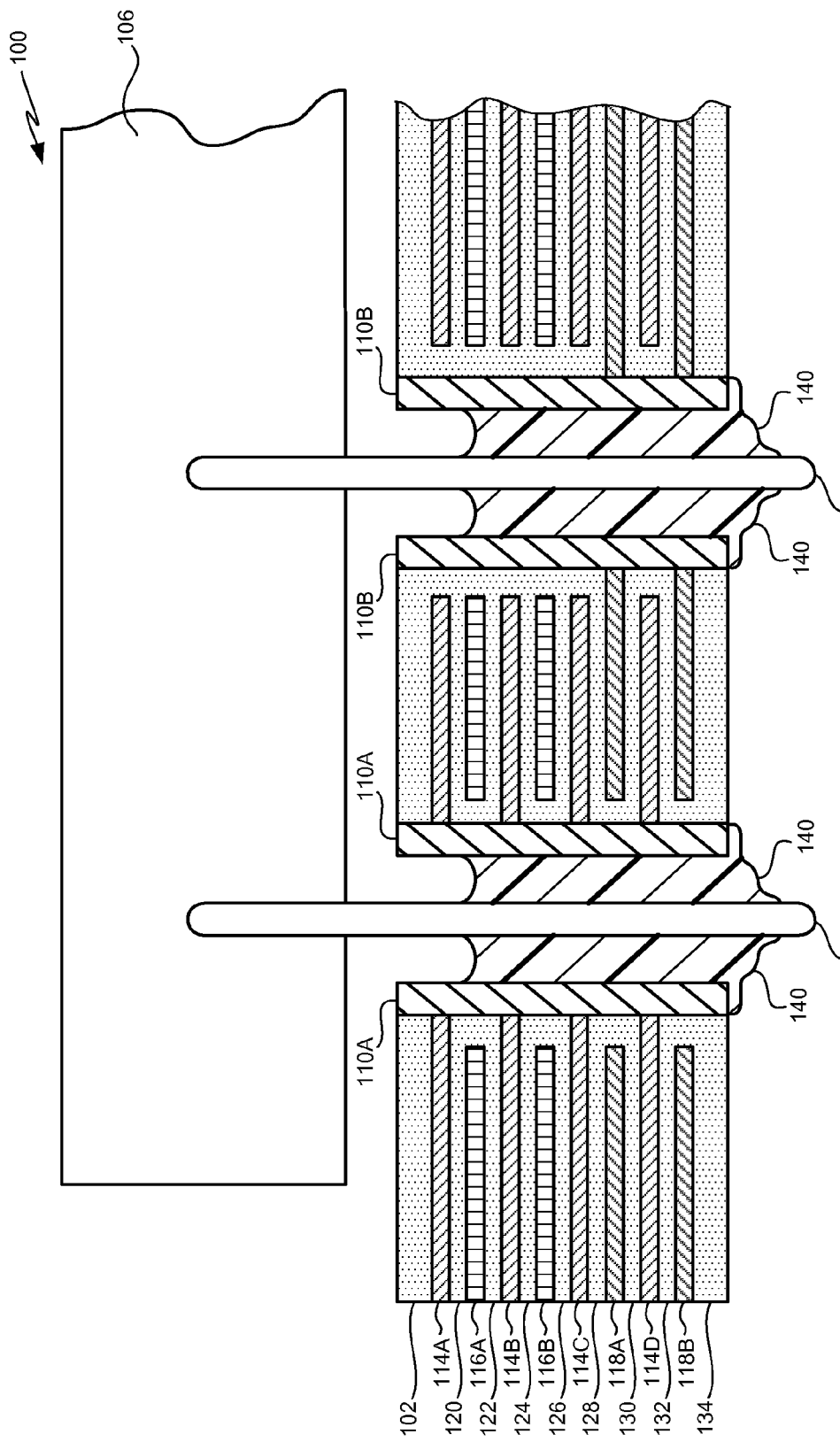
FIG. 2 is a cross-sectional view showing non-completely filled PTHs of the prior art multi-layer PCB of FIG. 1.
Figure 3:
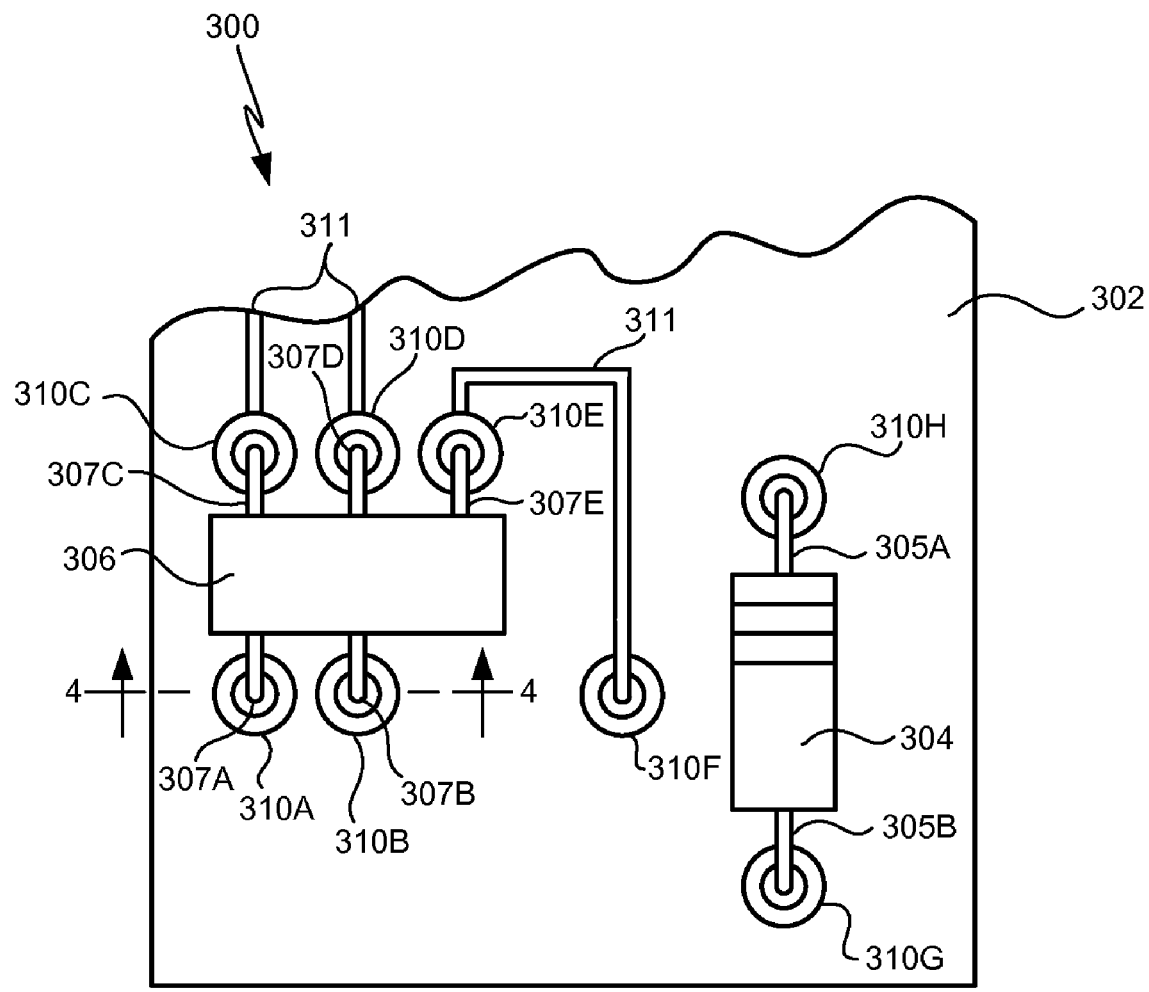
FIG. 3 illustrates one embodiment of a multi-layer PCB configured with various electronic components including an IC.

FIGS. 3 and 4 illustrate top and cross-sectional views of a multi-layer PCB 300 that provides enhanced connections with electronic component leads, pins or the like, particularly when the components are attached to the PCB 300 using a lead-free solder process. The top view of FIG. 3 is similar to that of FIG. 1, but as can be seen from the cross-sectional view of FIG. 4, a number of features of the PCB 300 are present that differ from the prior PCB 100 of FIGS. 1 and 2.

The PCB 300 is configured with a resistor 304 and an integrated circuit (IC) 306. The PCB 300 includes a plurality of plated through-holes (PTHs) 310 that may be used to couple electronic components (e.g., the resistor 304 and the IC 306) from the top layer 302 of the PCB 300 to one or more conductors (not shown in FIG. 3) within or on the bottom surface of the PCB 300. In this regard, the PTHs 310 may receive component leads or pins 305A-305B, 307A-307E extending from the electronic components 304, 306. The PCB 300 may also include a plurality of metal traces (e.g., copper traces 311) that are operative to couple different components of the PCB 300 together. Although the PTHs 310 and component leads or pins 305A-305B, 307A-307E are illustrated with circular cross-sections, they may, in general, be of any desired cross-section (e.g., circular, rectangular, triangular, etc.).

FIG. 4 illustrates a cross-sectional view of a portion of the PCB 300 shown in FIG. 3 cut at the line 4-4. As shown, the PCB 300 includes a plurality of dielectric layers 302, 320, 322, 324, 326, 328, 330, 332 and 334. The PCB 300 also includes a plurality of electrically conductive layers 314A-314D, 316A-316B, 318A-318B disposed between (or outside of) the dielectric layers (e.g., the conductive and dielectric layers alternate). The electrically conductive layers 314A-314D, 316A-316B, 318A-318B can be made of copper, but, in general, any other electrically conductive material or combination of materials may be used (e.g. aluminum, gold, etc.). The dielectric layers 302, 320-334 can be made of epoxy resin (e.g., FR4), polyimide, polytetrafluoroethylene (PTFE), or any other suitable dielectric material or combination of materials.

In the example shown, the IC 306 is coupled to two conductive layers 314A-314B (e.g., ground planes) of the PCB 300 by soldering a first pin 307A (e.g. the ground pin) of the IC 306 to the PCB 300 using a first PTH 310A that is completely filled with solder 340, and the IC 306 is also coupled to two conductive layers 318A-318B (e.g., power planes) of the PCB 300 by soldering a second pin 307B (e.g. the power pin) of the IC 306 to the PCB 300 using a second PTH 310B completely filled with solder 340. Of note, unlike in the PCB 100 of the FIG. 1, conductive layers 314C-314D do not extend all the way to the first PTH 110A, and are instead separated from the conductive lining of the first PTH 110A by dielectric material. Thus, the first pin 307A of the IC 306 is not coupled to ground planes 314C-314D. Further, the conductive layers 318A-318B (e.g. the power planes) coupled with the second pin 307B have been moved up in the multilayer PCB 300 stack. As described further hereinbelow, moving the conductive layers 318A-318B coupled with the second pin 307B into closer proximity with the conductive layers 314A-314B coupled with the first pin 307A minimizes return current loop inductance. Additional pins (not shown in FIG. 4) of the IC 306 may be coupled to additional conductive layers 316A-316B (e.g. signal planes) of the PCB 300 by soldering the additional pins of the IC 306 received within additional PTHs (not shown in FIG. 4) of the PCB 300. In this regard, the PCB 300 may include signal planes, ground planes, or power planes that are connected to other components.

As shown, solder 340 is used to mechanically and electrically couple the IC 306 to the PCB 300. In this regard, the first and second pins 307A-307B are respectively coupled via the solder 340 and the conductive linings of the respective first and second PTHs 310A-310B to the respective conductive layers 314A-314b, 318A-318B. It is noted that the conductive layers 316A-316B (e.g. signal planes) and 318A-318B (e.g., power planes) are separated from the conductive lining of the first PTH 310A by dielectric material and are therefore not connected to the first pin 307A. Likewise, the conductive layers 314A-314D (e.g. ground planes) and 316A-316B (e.g., signal planes) are separated from the conductive lining of the second PTH 310B by dielectric material and are therefore not connected to the second pin 307B.

As shown, the solder 340 completely fills the openings of the PTHs 310A-310B. During the soldering process, molten solder 340 completely fills the openings of the PTHs 310A-310B from the bottom to the top via capillary action without cooling too rapidly. This is because premature freezing during the soldering process is reduced or even eliminated altogether since the bottom two conductive layers 314C-314D are not coupled to the PTHs 310A-310B. By not coupling unnecessary conductive layers to the conductive linings of the PTHs, undesired heat sinking effects during the soldering process are reduced.

Unlike prior PCBs such as PCB 100 wherein all of the ground planes are connected to the ground pin of an electronic component in order to provide a "good ground", all of the ground planes in the PCB 300 are not connected to the ground pin in order to adequately ground an electronic component. Electronic components on the PCB 300 such as the IC 306 may provide any number of functions including, for example, DC to DC power conversion. As such, when operated the IC 306 may require a specified level of current into the device. The level of expected current into the IC 306 in turn determines an amount (e.g. weight in ounces or grams) of conductive material that is preferably incorporated into the PCB 300 and connected to the second pin 307B via the conductive lining of the second plated through-hole 310B and solder 340 in order to supply current to the IC 306. Although lesser amounts might be acceptable at times, it may be desirable to supply power to the IC 306 using an amount of conductive material that can tolerate a maximum expected current flow drawn by the IC 306 without overheating to avoid damaging the PCB 300. The desired amount of conductive material may be incorporated into a single thicker power plane, or as illustrated in FIG. 4, divided among two or more thinner power planes (e.g. conductive layers 318A-318B).

By application of Kirchhoff's Current Law, it is possible to determine how much current is expected out of the IC 306 via the first pin 307A. The expected amount of current out of the IC 306 via the first pin 307A can be used to determine the ground requirements for the IC 306. As with the power planes, the level of expected current out of the IC 306 in turn determines an amount (e.g. weight in ounces or grams) of conductive material that should be incorporated into the PCB 306 and connected to the first pin 307A via the conductive lining of the first plated through-hole 310A and solder 340 in order to dissipate current from the IC 306. Although lesser amounts might be acceptable at times, it may be desirable to dissipate power from the IC 306 using an amount of conductive material that can tolerate a maximum expected current flow from the IC 306 without overheating to avoid damaging the PCB 306. The desired amount of conductive material may be incorporated into a single thicker ground plane, or as illustrated in FIG. 4, divided among two or more thinner ground planes (e.g. conductive layers 314A-318B).

The total amount of electrically conductive material incorporated into the conductive layers 314A-314B connected to the first pin 307A of IC 306 can be specified in accordance with a ratio to the amount of electrically conductive material incorporated into the conductive layers 318A-318B connected to the second pin 307B of IC 306. The appropriate ratio may be predetermined by application of Kirchhoff's Current Law. Since Kirchhoff's Current Law states that the sum of the currents into a node equals the sum of the currents from the node, such ratio will typically be 1:1 (assuming that all of the current into the IC 306 via the second pin 307B is dissipated from the IC 306 via the first pin 307A). When other conditions are present (e.g. where some current is absorbed by the IC 306 and dissipated as heat or is dissipated from the IC 306 via the additional pins of the IC 306), the ratio may be different from 1:1. When the ground and power planes have substantially the same dimensions (e.g. thickness and area) and the predetermined ratio is 1:1, then the number of ground planes that need to be connected to the first pin 307A will equal the number of power planes connected to the second pin 307B of the IC 306. This is the situation illustrated in FIG. 4 wherein only two of the four available ground planes (conductive layers 314A-314B) are connected to the power pin (first pin 307A) since only two power planes (conductive layers 318A-318B) are connected to the power pin (second pin 307B).

Figure 5A:
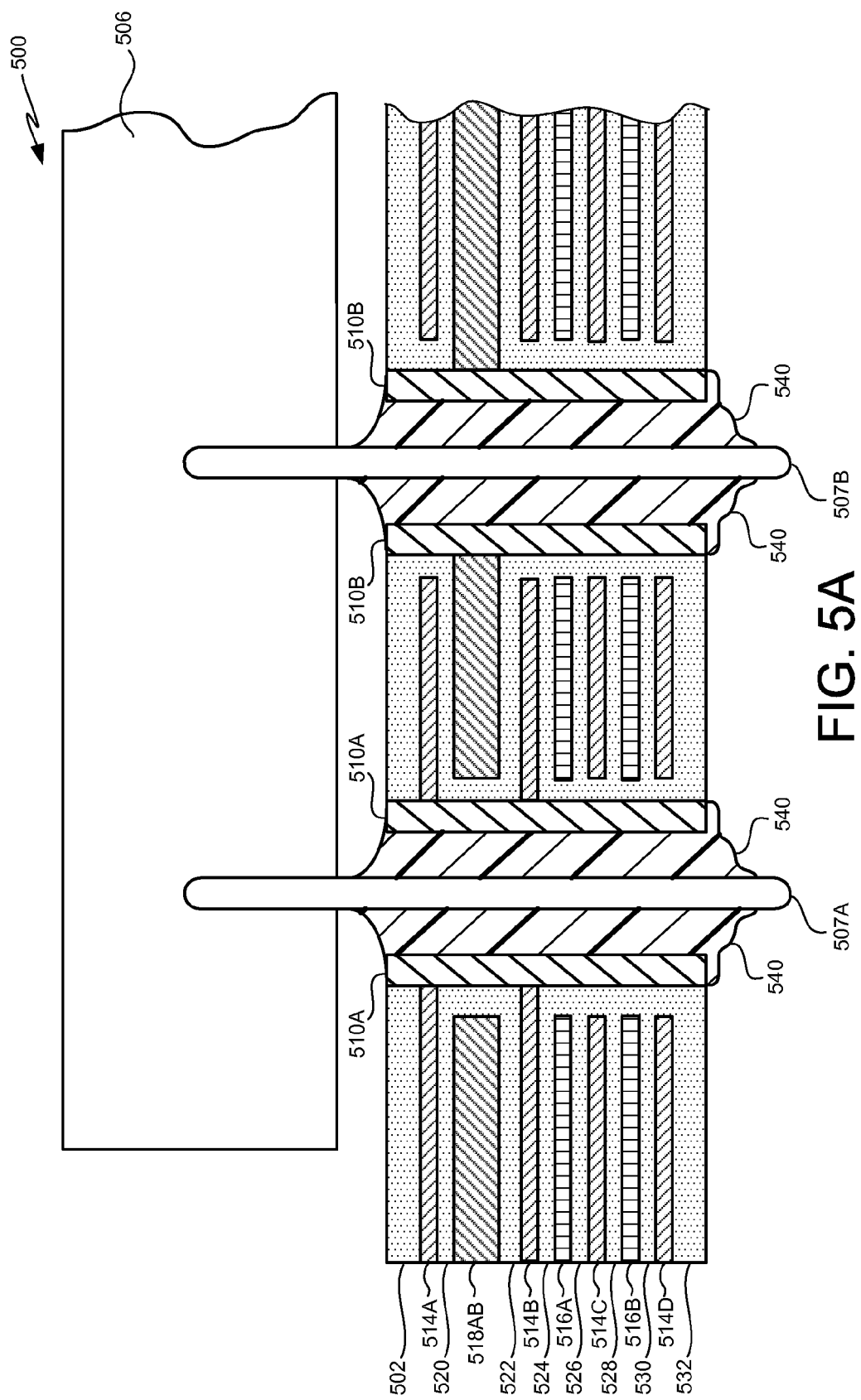
FIGS. 5A-5B are cross-sectional views showing additional embodiments of a multi-layer PCB in which the PTHs are completely filled.

Referring the FIG. 5A, the power plane(s) may comprise a single thicker layer while the ground plane(s) comprise separate layers while still maintaining the predetermined ratio. Such a situation is illustrated in FIG. 5A in which a multi-layer PCB 500 includes a plurality of dielectric layers 502, 520-532 and a plurality of electrically conductive layers 514A-514D (e.g. ground planes), 516A-516B (e.g. signal planes), and 518AB (e.g. a power plane). Only one electrically conductive layer 518AB (e.g. the thicker power plane) is connected to the second pin 507B of the IC 506 and two electrically conductive layers 514A-514B (e.g., the ground planes) are connected to the first pin 507A of the IC 506. In the embodiment of FIG. 5A, the combined total amount of electrically conductive material in the thinner conductive layers 514A-514B is in a 1:1 ratio to the total amount of electrically conductive material in the single thicker conductive layer 518AB.

Figure 5B:
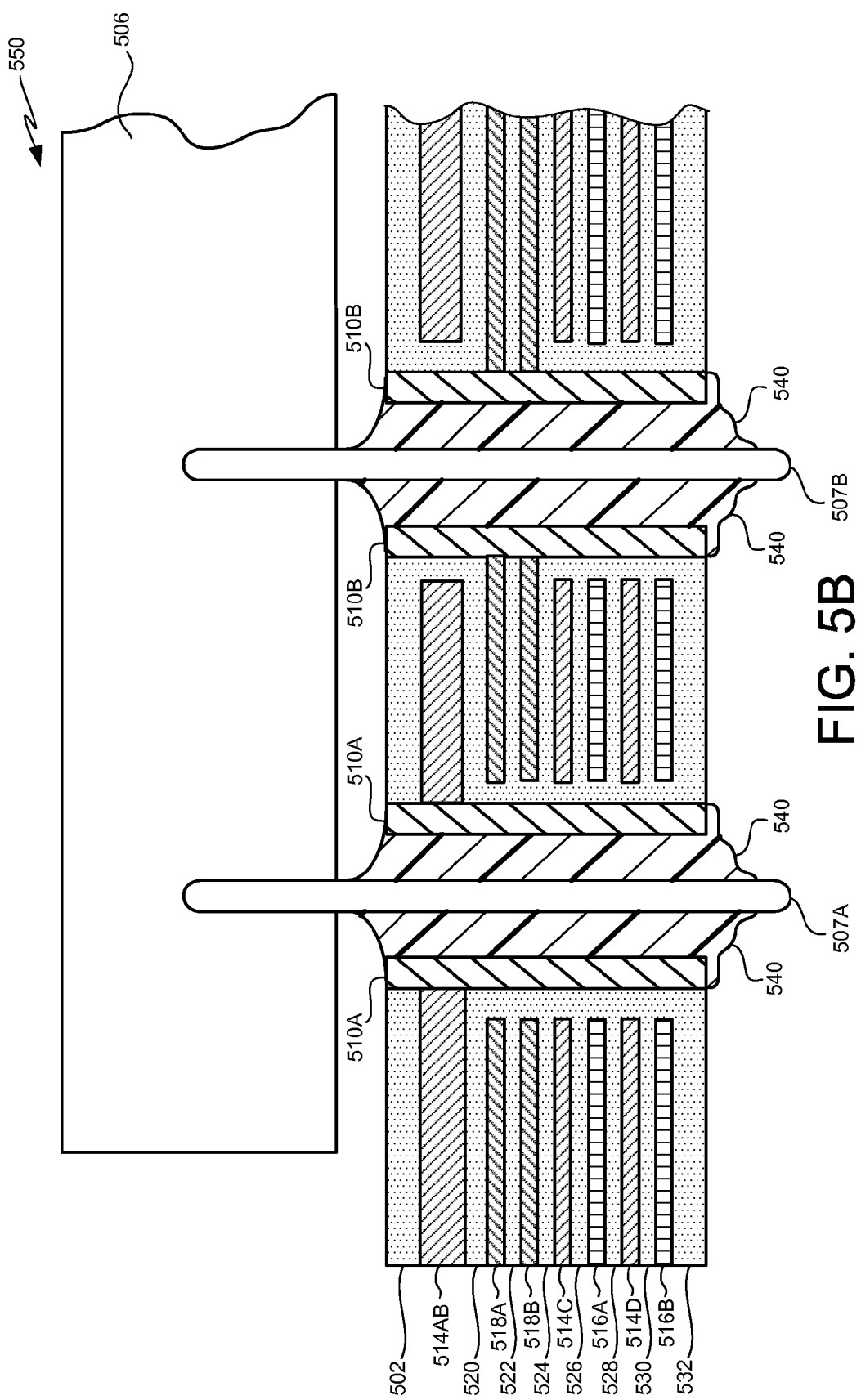

Referring the FIG. 5B, the ground plane(s) may comprise a single thicker layer while the power plane(s) comprise separate layers while still maintaining the predetermined ratio. Such a situation is illustrated in FIG. 5B wherein a multi-layer PCB 550 includes a plurality of dielectric layers 502, 520-532 and a plurality of electrically conductive layers 514AB, 514C, 514D (e.g. ground planes), 516A-516B (e.g. signal planes), and 518A-518B (e.g. power planes). Only one electrically conductive layer 514AB (e.g. the thicker ground plane) is connected to the first pin 507A of the IC 506 and two electrically conductive layers 518A-518B (e.g., the power planes) are connected to the second pin 507B of the IC 506. In the embodiment of FIG. 5B, the total amount of electrically conductive material in the single thicker conductive layer 514AB is in a 1:1 ratio to the total amount of electrically conductive material in the thinner conductive layers 518A-518B.

Although the optimization of power and ground connections within a multi-layer PCB has been specifically illustrated in the context of an integrated circuit, optimization of power and ground connections can be applied to any electronic components that include leads, pins or the like that may be coupled to a PCB using PTHs. FIGS. 6A-6C illustrate examples of various such electronic components. More specifically, FIG. 6A shows a resistor 600; FIG. 6B shows a transistor 602; and FIG. 6C shows an integrated circuit 604 (e.g. a DC to DC power converter). In addition to such discrete and single integrated components, the electronic component that is connected in the optimized manner described herein may be comprised of two or more interconnected discrete and/or integrated components.

Another feature of note with the multi-layer PCBs 300, 500, 550 of FIGS. 3-5B, is the arrangement of the electrically conductive layers within the multi-layer PCB stack. In this regard, the electrically conductive layers therein have been specifically arranged so as to minimize return current loop inductance among the electrically conductive layers 314A-314B, 514A-514B, 514AB (e.g. the ground planes) connected to the first PTHs 310A, 510A and the electrically conductive layers 318A-318B, 518AB, 518A-518B (e.g. the power planes) connected to the second PTHs 310B, 510B. Such inductance due to current through the layers that are part of a closed loop circuit is reduced by positioning the electrically conductive layers 314A-314B, 514A-514B, 514AB proximal to the electrically conductive layers 318A-318B, 518AB, 518A-518B included in the second subset of the plurality of electrically conductive layers while minimizing the number of intervening electrically conductive layers that are not connected to the first and second PTHs 310A, 510A, 310B, 510B. More particularly, electrically conductive layers 314C-314D, 514C-514D (e.g. unconnected ground planes) and electrically conductive layers 316A-316B, 516A-516B (e.g. signal layers) are not positioned within the stack between any of the electrically conductive layers 314A-314B, 514A-514B, 514AB connected to the first PTHs 310A, 510A and the electrically conductive layers 318A-318B, 518AB, 518A-518B connected to the second PTHs 310B, 510B. Such an arrangement of the electrically conductive layers within the multi-layer PCB stack is not required and there may be one or more intervening layers (e.g. signal planes, other ground planes and/or other power planes) when necessary in view of additional design considerations, but minimizing unconnected intervening layers may be desirable to achieve when possible.

While the invention has been illustrated and described in detail in the drawings and foregoing description, such illustration and description is to be considered as exemplary and not restrictive in character. For example, certain embodiments described hereinabove may be combinable with other described embodiments and/or arranged in other ways (e.g., process elements may be performed in other sequences). Accordingly, it should be understood that only the preferred embodiment and variants thereof have been shown and described and that all changes and modifications that come within the spirit of the invention are desired to be protected.

We claim:

1. A multi-layer printed circuit board, comprising:
a plurality of electrically conductive layers with dielectric material disposed between the electrically conductive layers, the plurality of electrically conductive layers including a group of power planes and a group of ground planes;
a first plated through-hole that extends through the multi-layer printed circuit board, the first plated through-hole including an electrically conductive lining that forms a barrel for receiving a first lead of an electronic component; and
a second plated through-hole that extends through the multi-layer printed circuit board, the second plated through-hole including an electrically conductive lining that forms a barrel for receiving a second lead of the electronic component;
wherein a first subset of the group of ground planes is electrically and mechanically connected to the electrically conductive lining of the first plated through-hole, and wherein a second subset of the group of ground planes is free from electrical and mechanical connections to the electrically conductive lining of the first plated through-hole; and
wherein the group of power planes is electrically and mechanically connected to the electrically conductive lining of the second plated through-hole.

2. The multi-layer printed circuit board of claim 1, wherein the plurality of electrically conductive layers in the multi-layer printed circuit board are arranged to minimize return current loop inductance among the first subset of the group of ground planes and the group of power planes.

3. The multi-layer printed circuit board of claim 1, wherein the first subset of the group of ground planes is positioned within the multi-layer printed circuit board proximal to the group of power planes with a minimum number of intervening electrically conductive layers that are not included in the first subset of the group of ground planes or the group of power planes.

4. The multi-layer printed circuit board of claim 1, wherein the electrically conductive lining of the first and second plated through-holes comprises copper and wherein the electrically conductive layers are comprised of copper.

5. The multi-layer printed circuit board of claim 1, further comprising:
solder contained within a substantial entirety of the barrel of the first and second plated through-holes.

6. A multi-layer printed circuit board, comprising:
a plurality of electrically conductive layers with dielectric material disposed between the electrically conductive layers, the plurality of electrically conductive layers including power planes and ground planes;
a first plated through-hole extending through the multi-layer printed circuit board, the first plated through-hole including an electrically conductive lining forming a barrel for receiving a first lead of an electronic component; and
a second plated through-hole that extends through the multi-layer printed circuit board, the second plated through-hole including an electrically conductive lining that forms a barrel for receiving a second lead of the electronic component;
wherein each ground plane comprises an amount of an electrically conductive material, and wherein at least some of the ground planes are electrically and mechanically connected to the electrically conductive lining of the first plated through-hole, at least some of the ground planes are free from electrical and mechanical connections to the electrically conductive lining of the first plated through-hole; and
wherein each power comprises an amount of an electrically conductive material, wherein at least some of the power planes are electrically and mechanically connected to the electrically conductive lining of the second plated through-hole, and wherein a ratio of the total amount of electrically conductive material of the ground planes that are electrically and mechanically connected to the electrically conductive lining of the first plated through hole to total amount electrically conductive material of the power planes that are electrically and mechanically connected to the electrically conductive lining of the second plated through-hole is substantially 1:1.

7. The multi-layer printed circuit board of claim 6, wherein the number of ground planes that are electrically and mechanically connected to the electrically conductive lining of the first plated through-hole equals the number of power planes that are electrically and mechanically connected to the electrically conductive lining of the second plated through-hole.

8. The multi-layer printed circuit board of claim 6, wherein the plurality of electrically conductive layers in the multi-layer printed circuit board are arranged to minimize return current loop inductance among the ground planes that are electrically and mechanically connected to the electrically conductive lining of the first plated through-hole and the power planes that are electrically and mechanically connected to the electrically conductive lining of the second plated through-hole.

9. The multi-layer printed circuit board of claim 6, wherein the ground planes that are electrically and mechanically connected to the electrically conductive lining of the first plated through hole are positioned within the multi-layer printed circuit board proximal to the power planes that are electrically and mechanically connected to the electrically conductive lining of the second plated through-hole with a minimum number of intervening electrically conductive layers that are free from electrical and mechanical connections to the electrically conductive lining of the first or second plated through-holes.

10. The multi-layer printed circuit board of claim 6, further comprising:
solder contained within a substantial entirety of the barrel of the first and second plated through-holes.

11. The multi-layer printed circuit board of claim 6, wherein the electrically conductive lining of at least one of the first and second plated through-holes comprises copper.

12. The multi-layer printed circuit board of claim 6, wherein at least some of the electrically conductive layers are comprised of copper.

13. A multi-layer printed circuit board, comprising:
a plurality of electrically conductive layers with dielectric material disposed between the electrically conductive layers, the plurality of electrically conductive layers including a group of power planes and a group of ground planes;
a first plated through-hole that extends through the multi-layer printed circuit board, the first plated through-hole including an electrically conductive lining that forms a barrel for receiving a first lead of an electronic component; and
a second plated through-hole that extends through the multi-layer printed circuit board, the second plated through-hole including an electrically conductive lining that forms a barrel for receiving a second lead of the electronic component;
wherein a first subset of the group of ground planes is electrically and mechanically connected to the electrically conductive lining of the first plated through-hole, and wherein a second subset of the group of ground planes is free from electrical and mechanical connections to the electrically conductive lining of the first plated through-hole;
wherein the group of power planes is electrically and mechanically connected to the electrically conductive lining of the second plated through-hole; and
wherein the group of power planes and the first subset of the group of ground planes are free of the second subset of the group of ground planes being positioned therebetween.

14. The multi-layer printed circuit board of claim 13, wherein each of the power planes and ground planes comprises an amount of an electrically conductive material, and wherein a ratio of the total amount of electrically conductive material of the first subset of the group of ground planes to the total amount of electrically conductive material of the group of power planes is substantially 1:1.

15. The multi-layer printed circuit board of claim 13, wherein the number of ground planes in the first subset of the group of ground planes equals the number of power planes in the group of power planes.

16. The multi-layer printed circuit board of claim 13, further comprising:
solder contained within a substantial entirety of the barrel of the first and second plated through-holes.

17. The multi-layer printed circuit board of claim 13, wherein the electrically conductive lining of at least one of the first and second plated through-holes comprises copper.

18. The multi-layer printed circuit board of claim 13, wherein at least some of the electrically conductive layers are comprised of copper.

* * * * *